(12) United States Patent
Aizawa et al.

(10) Patent No.: US 7,907,263 B2
(45) Date of Patent: Mar. 15, 2011

(54) APPARATUSES AND METHODS USING MEASUREMENT OF A FLARE GENERATED IN AN OPTICAL SYSTEM

(75) Inventors: Michiko Aizawa, Utsunomiya (JP); Eiji Aoki, Utsunomiya (JP); Osamu Kakuchi, Mito (JP); Yoshiyuki Kuramoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 26 days.

(21) Appl. No.: 12/493,229

(22) Filed: Jun. 28, 2009

(65) Prior Publication Data
US 2010/0002243 A1 Jan. 7, 2010

(30) Foreign Application Priority Data

Jul. 1, 2008 (JP) ................. 2008-172642

(51) Int. Cl.
*G01B 9/00* (2006.01)
*G01B 9/02* (2006.01)
*G01B 11/02* (2006.01)

(52) U.S. Cl. .......... 356/124; 356/515; 356/521
(58) Field of Classification Search ......... 356/124, 356/511, 512, 515, 521
See application file for complete search history.

(56) References Cited

U.S. PATENT DOCUMENTS

| 7,428,058 | B2 | 9/2008 | Hill | |
|---|---|---|---|---|
| 2006/0285124 | A1* | 12/2006 | Hill | ............................... 356/521 |
| 2010/0110403 | A1* | 5/2010 | Ogasawara | ...................... 355/55 |

OTHER PUBLICATIONS

Tsuneo Kanda et ala., 0.85NA ArF Exposure System and Performance, Proc. SPIE, vol. 5040 pp. 789-800 2003.
Mark Van De Kerkhof, et al., Full optical column characterization of DUV lithographic projection tools, Proc. SPIE 2004, vol. 5377 p. 1960-1970.
Kafai Lai et al., , New paradigm in Lens metrology for lithographic sacanner: evaluation and exploration, Proc. SPIE 2004, vol. 5377 p. 160-171.

* cited by examiner

*Primary Examiner* — Patrick J Connolly
(74) *Attorney, Agent, or Firm* — Canon U.S.A., Inc., IP Division

(57) ABSTRACT

The present invention provides a method including measuring a wavefront aberration of the optical system to be measured on a measurement surface, measuring a pupil transmittance distribution of the optical system determining a pupil function of the optical system based on the wavefront aberration and the pupil transmittance distribution, and performing imaging computation using the pupil function to obtain a light intensity distribution formed on an image plane of the optical system, and calculating a flare, generated in the optical system, from the light intensity distribution.

6 Claims, 11 Drawing Sheets

F I G. 8
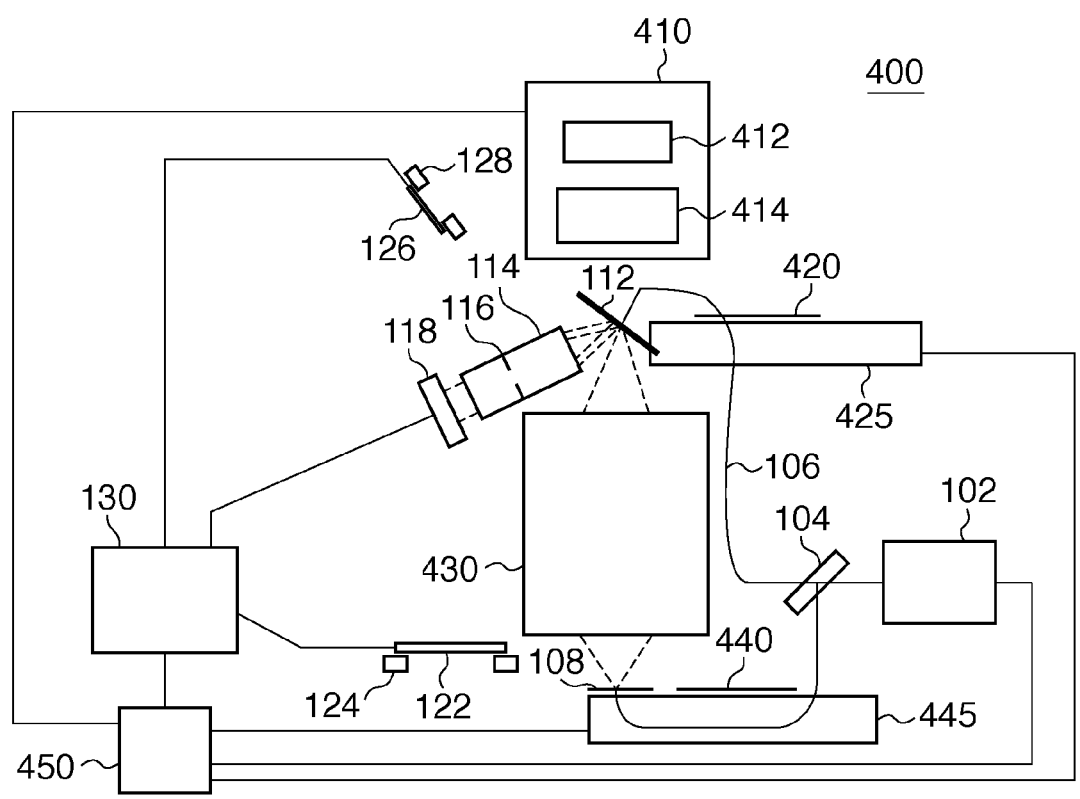

FLARE[%] = α / β × 100

APPARATUSES AND METHODS USING MEASUREMENT OF A FLARE GENERATED IN AN OPTICAL SYSTEM

BACKGROUND OF THE INVENTION

1. Field of the Invention

The present invention relates to an optical system and more particularly to the measuring of a flare in an optical system.

2. Description of the Related Art

A projection exposure apparatus has been conventionally employed to fabricate a micropatterned semiconductor device using photolithography. The projection exposure apparatus projects and transfers a circuit pattern formed on a reticle (mask) onto a substrate such as a wafer by a projection optical system. In recent years, as micropatterning of semiconductor devices advances, a demand for the line width uniformity of a pattern transferred onto a wafer is becoming stricter. Along with this trend, degradation in line width uniformity attributed to a flare generated in the projection optical system, which falls within the conventional tolerance, may become an issue. The flare means herein stray light which adversely affects reticle pattern imaging.

Flares generated in an optical system such as a projection optical system are roughly classified into a local flare attributed to forward-scattered light generated on the surface of an optical member (e.g., a lens) or a coating film on an optical member, and a long-range flare attributed to light reflected by a coating film on an optical member. A flare that degrades the line width uniformity is a local flare, which will be referred to as a flare hereinafter.

The Kirk method, for example, is known as a flare measurement method (see "0.85NA ArF Exposure System and Performance", Proc. SPIE, Vol. 5040, pp. 789-800, 2003). The Kirk method as a flare measurement method will be explained with reference to FIGS. 10A, 10B, and 11A to 11D. FIGS. 10A and 10B are views showing a measurement pattern MP used in the Kirk method, in which FIG. 10A is a schematic top view of the measurement pattern MP, and FIG. 10B is a schematic sectional view of the measurement pattern MP. FIGS. 11A to 11D are schematic sectional views showing a resist pattern formed on a substrate by illuminating the measurement pattern MP with exposure light.

In the Kirk method, a measurement pattern MP having a box pattern BP made of a light-shielding film and a clear field CF which surrounds the box pattern BP is illuminated with exposure light to form a resist pattern on a substrate, as shown in FIGS. 10A and 10B. At this time, in response to a change in the exposure amount (exposure time), the sectional shape of the resist pattern corresponding to the box pattern BP formed on the substrate changes as shown in FIGS. 11A to 11D. Using this effect, the exposure amount is increased to obtain an exposure amount $\alpha$ when any resist other than the resist pattern corresponding to the box pattern BP is removed (FIG. 11B), and an exposure amount $\beta$ when the resist pattern corresponding to the box pattern BP disappears due to the influence of flares (FIG. 11D). Then, the ratio of the exposure amount $\alpha$ to the exposure amount $\beta$ ($\alpha/\beta \times 100$ [%]) is determined as a flare.

Another known method measures flares with different scattering distances using a measurement pattern having a plurality of different patterns. Still another known method measures a flare by detecting an aerial image (optical image) of a measurement pattern by a sensor, instead of illuminating a measurement pattern with exposure light to form a resist pattern on a substrate.

A method of measuring the wavefront aberration of the projection optical system, and calculating a flare attributed to the wavefront aberration has also been proposed (see "Full optical column characterization of DUV lithographic projection tools", Proc. SPIE 2004, Vol. 5377, p. 1960, and "New paradigm in Lens metrology for lithographic scanner: evaluation and exploration", Proc. SPIE 2004, Vol. 5377, p. 160). More specifically, a flare is calculated by inputting the measured wavefront aberration or the PSD (Power Spectral Density) or PSF (Point Spread Function) obtained from the wavefront aberration to an optical (imaging) simulator.

This method can obtain information concerning the flare scattering distance and directionality from one wavefront aberration (i.e., the wavefront aberration of the projection optical system on one measurement surface). This method also can calculate flares generated under various kinds of exposure conditions including, for example, the reticle pattern and the illumination condition. The limit of the computable flare scattering distance depends on the spatial resolution with which the wavefront aberration is measured, and the spatial resolution mainly depends on the pixel size of a sensor which senses an interference pattern (interference fringes).

Unfortunately, to measure flares generated under various kinds of exposure conditions, the method of measuring a flare by illuminating a measurement pattern with exposure light and the method of measuring a flare by detecting an aerial image by a sensor perform flare measurement for each set of the exposure conditions, resulting in an increase in the measurement load. In addition, to obtain information concerning the flare directionality, these methods perform a larger number of times of measurement.

In the method of calculating a flare from the wavefront aberration, the measurement limit of the flare scattering distance depends on the measurement limit of the spatial frequency of the wavefront aberration. This is because the flare scattering distance is proportional to the spatial frequency of the wavefront aberration. To obtain a flare with a long scattering distance, it is said to improve the spatial resolution with which the wavefront aberration is measured and to reduce deterioration in high-frequency components or high-frequency measurement noise in a measurement apparatus which measures the wavefront aberration. Despite this common view, the result of close examinations conducted by the inventor of the present invention proved that even when the wavefront aberration is measured while ensuring a sufficiently high spatial resolution and reducing deterioration in high-frequency components, only one high-resolution wavefront aberration is insufficient to obtain a flare with a long scattering distance (20 μm or more) with high accuracy.

SUMMARY OF THE INVENTION

The present invention provides a technique which can measure a wide range of flares.

According to one aspect of the present invention, there is provided a method including measuring a wavefront aberration of the optical system to be measured on a measurement surface, measuring a pupil transmittance distribution of the optical system determining a pupil function of the optical system based on the measured wavefront aberration and the measured pupil transmittance distribution performing imaging computation using the determined pupil function to obtain a light intensity distribution formed on an image plane of the optical system, and calculating a flare, generated in the optical system, from the light intensity distribution.

Further features of the present invention will become apparent from the following description of exemplary embodiments with reference to the attached drawings.

BRIEF DESCRIPTION OF THE DRAWINGS

FIG. 8 is a schematic view showing an exposure apparatus according to one aspect of the present invention.

DESCRIPTION OF THE EMBODIMENTS

Figure 1:
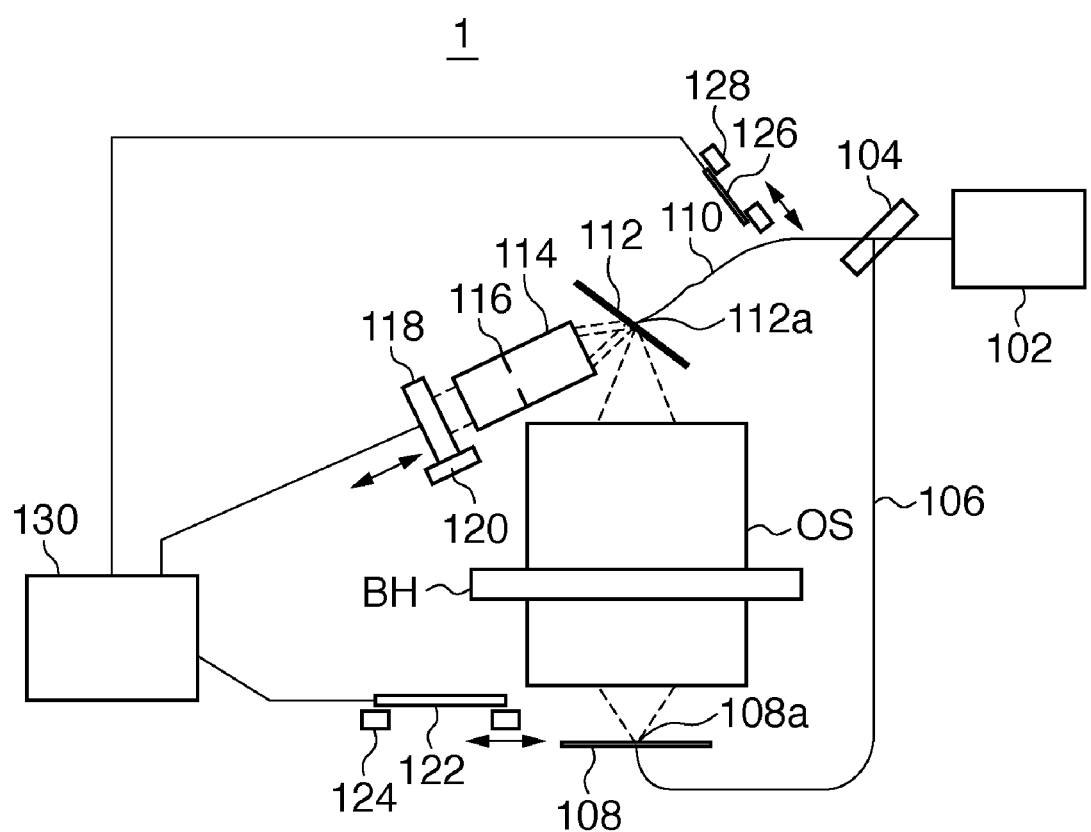
FIG. 1 is a schematic view showing a measurement apparatus according to one aspect of the present invention.

For the sake of a better understanding of the present invention, the reason why it is hard to obtain a flare with a long scattering distance (20 μm or more) with high accuracy by a method of calculating a flare only from the wavefront aberration of a projection optical system (optical system to be measured) will be explained first.

Imaging in an exposure apparatus (the relationship between a reticle and a wafer) is accounted for by partial coherent imaging described by:

$$I(v) = \iint \Gamma(u_1, u_2) \cdot a(u_1) \cdot a^*(u_2) \cdot F(v-u_1) \cdot F^*(v-u_2) du_1 du_2 \quad (1)$$

where $\Gamma(u_1, u_2)$ is the Fourier transform of the effective light source; $a(u_1) \cdot a^*(u_2)$ is the transmittance (amplitude transmittance) of an object (a reticle in an exposure apparatus); and $F(v-u_1)$ and $F(v-u_2)$ is the amplitude transmission function from an object point to an image point, and is the Fourier transform of the pupil function of an optical system. Note that the pupil function represents the wavefront of light, emanating from a point source, in the exit pupil and is unique to each optical system, whereas the effective light source and the object transmittance can be arbitrarily set to match given exposure conditions. Hence, as long as the pupil function of the optical system is obtained, it is possible to calculate the image distribution under arbitrary exposure conditions based on relation (1).

A pupil function $P(x, y)$ is given by the product of $T(x, y)$, which is transmittance at pupil coordinate $(x, y)$ (hereinafter, pupil transmittance), and a term that depends on a $W(x, y)$, which is wavefront aberration at pupil coordinate $(x, y)$ (hereinafter, pupil wavefront aberration):

$$P(x, y) = \begin{bmatrix} T(x, y) \cdot \exp\left[-\frac{2\pi}{\lambda} i W(x, y)\right] & \text{for } x^2 + y^2 \le 1 \\ 0 & \text{for } x^2 + y^2 > 1 \end{bmatrix} \quad (2)$$

This reveals that a pupil transmittance $T(x, y)$ and a pupil wavefront aberration $W(x, y)$ are used to obtain a pupil function $P(x, y)$. The pupil transmittance $T(x, y)$ and the pupil wavefront aberration $W(x, y)$ mean herein the transmittance distribution and the wavefront aberration, respectively, on the pupil plane of the optical system.

Information concerning high-spatial-frequency components of both the pupil transmittance distribution and pupil wavefront aberration is used in obtaining a flare. Especially obtaining a flare with a long scattering distance has been conventionally known to use information on wavefront aberration with a high spatial resolution. However, since high-frequency components of the transmittance distributions of, for example, a glass material used in the optical member (e.g., a lens) which constitutes the optical system, and a coating film formed on the optical member are generally small, it is customary to ignore high-frequency components of the pupil transmittance distribution, and therefore the pupil transmittance distribution is not measured with a high spatial resolution.

Nevertheless, despite the fact that high-frequency components of the transmittance distributions of, e.g., a glass material used in the optical member which constitutes the optical system, and a coating film formed on the optical member are very small, those of the pupil transmittance distributions are not small in the presence of a high-frequency phase error shape as a cause for flares. This is because the product of the transmittance distributions of respective optical members which constitute the optical system does not match the pupil transmittance distribution of the optical system due to factors associated with light properties based on wave optics.

When the optical member suffers a shape error or a refractive index error, a light wave immediately after passing through the optical member contains a phase error with a shape conforming to the shape error or the refractive index error. However, this phase error changes as the light wave propagates due to factors associated with light properties based on wave optics. For example, in the process of the light wave propagation, some or all phase undulation components turn into amplitude undulation components, or the undulation direction changes. When this occurs, a high-frequency amplitude distribution is generated in the propagating light wave despite the fact that the optical member has no high-frequency transmittance distribution. A Talbot image is known as a typical phenomenon in which the phase information and amplitude information change in the process of the light wave propagation. This is a phenomenon in which as light with a wavelength λ propagates (passes) through a transmittance distribution with a spatial period L, phase undulation and amplitude (intensity) undulation appear at an interval of $L^2/(2\lambda)$ (for each propagation distance).

When such light properties based on wave optics are taken into consideration, a phase error of each optical member generates a high-frequency transmittance distribution on a certain measurement surface (observation surface) such as the pupil plane despite the fact that high-frequency components of the transmittance distribution of each optical member are small. Especially information concerning a flare with a long scattering distance, that is, that concerning high-spatial-frequency components of the pupil transmittance distribution is non-negligible because a propagation distance at which phase undulation turns into amplitude undulation is shortened so that the spatial resolution becomes higher.

(It is a common practice to measure the wavefront aberration of an optical system as a phase error, while a certain surface, for example, the pupil plane of the optical system to be measured, is in focus. Hereinafter, such a surface which is in focus is called a measurement surface or observation surface. However, when a flare is calculated from the thus obtained wavefront aberration alone, this means that a flare attributed to a high-frequency pupil transmittance distribution on the same measurement plane is not calculated. In this case, it is impossible to obtain a flare with a long scattering distance (20 µm or more) with sufficiently high accuracy.

Figure 10A:
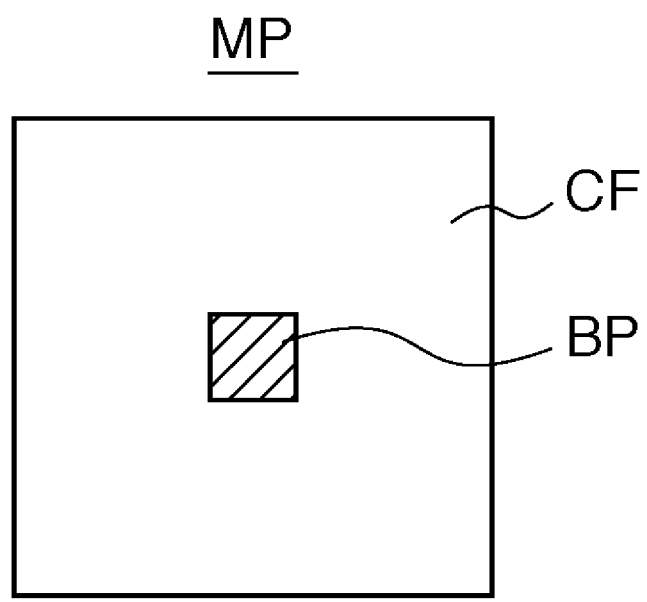
FIGS. 10A and 10B are a schematic top view and schematic sectional view, of a measurement pattern used in the Kirk method as a flare measurement method, for explaining the Kirk method.
Figure 10B:
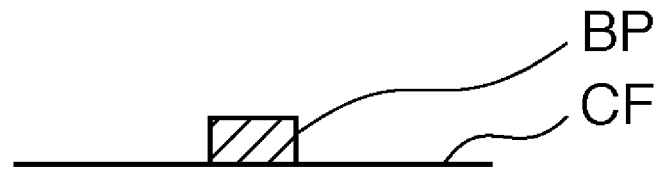
Figure 11A:
FIGS. 11A to 11D are schematic sectional views showing a resist pattern formed on a substrate by illuminating the measurement pattern shown in FIGS. 10A and 10B with exposure light.
Figure 11B:
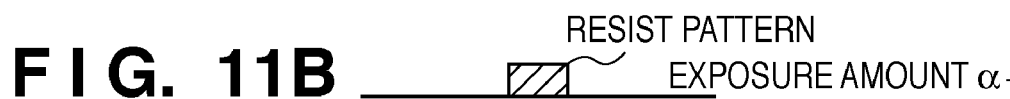
Figure 11C:
Figure 11D:
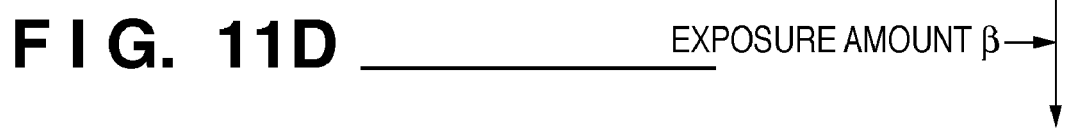

Under the circumstance, the present invention obtains a pupil function including both a pupil wavefront aberration and pupil transmittance distribution with a sufficiently high spatial resolution for the flare scattering distance, and calculates a flare using the obtained pupil function. This makes it possible to obtain a wide range of flares including a flare with a long scattering distance (a flare with a scattering distance of about one to several hundreds of micrometers) with high accuracy while suppressing an increase in the measurement load. For example, a flare equivalent to that measured by the Kirk method can be obtained by setting an amplitude transmittance distribution of an object equal to a measurement pattern used in Kirk method (see FIGS. 10A and 10B). Flares with different scattering distances can be obtained by changing the amplitude transmittance distribution of an object (this amounts to changing the measurement pattern). An optical image containing flares can be estimated under arbitrary exposure conditions including, for example, an arbitrary reticle pattern and an arbitrary illumination condition, thus directly obtaining a flare upon imaging.

As will be explained in the first embodiment, the measurement surface is not limited to the pupil plane, and a flare can be obtained using a pupil function determined from the wavefront aberration and pupil transmittance distribution on an arbitrary measurement surface.

As will be explained in the second embodiment, a flare can be obtained using the wavefront aberrations on a plurality of measurement surfaces.

As will be explained in the third embodiment, a flare can be obtained by measuring the wavefront aberrations a plurality of times while changing the phase difference between a 0th-order light component and ±1st-order light components by a known amount, and using the plurality of measured wavefront aberrations.

Various embodiments of the present invention will be described below with reference to the accompanying drawings. Note that the same reference numerals denote the same members throughout the drawings, and a repetitive description thereof will not be given.

In a first embodiment, the wavefront aberration and pupil transmittance distribution on an arbitrary measurement surface (observation surface) of an optical system to be measured such as a projection optical system, are measured, and a flare generated in the optical system to be measured is obtained from the measured wavefront aberration and pupil transmittance distribution.

The wavefront aberration and pupil transmittance distribution of the optical system to be measured may be measured by one measurement apparatus or may be individually measured by two measurement apparatuses dedicated to the respective types of measurement. A case in which one measurement apparatus measures both the wavefront aberration and pupil transmittance distribution of the optical system to be measured will be exemplified herein.

Although a variety of measurement methods are applicable to the measurement of the wavefront aberration of the optical system to be measured, a measurement method which uses an interferometer is adopted herein. Although the interferometer includes, for example, a Twyman-Green interferometer, Fizeau interferometer, point diffraction interferometer (PDI), shearing interferometer, and line diffraction interferometer (LDI), the PDI will be exemplified herein.

FIG. 1 is a schematic view showing a measurement apparatus 1 according to one aspect of the present invention. The measurement apparatus 1 has functions of measuring the wavefront aberration of an optical system to be measured OS (hereinafter, optical system OS), and of measuring the pupil transmittance distribution of the optical system to be measured OS, and measures a flare generated in the optical system OS. Note that the optical system OS is held and fixed in position by a bench BH in the measurement apparatus 1.

If impurities (for example, particles or contaminants) adhere onto the optical system OS or an optical system which constitutes the measurement apparatus 1, they may degrade the measurement accuracy or become a new source of flares. Hence, the environment under which the measurement apparatus 1 and the optical system OS are set (the optical paths of at least the measurement apparatus 1 and optical system OS) to be purged with an inert gas such as nitrogen.

As shown in FIG. 1, the measurement apparatus 1 includes a light source 102, a beam splitter 104, an extension optical system 106, a pinhole plate 108 having a pinhole 108a, an extension optical system 110, and a pinhole mirror 112 having a pinhole 112a. The measurement apparatus 1 also includes a pupil imaging optical system 114, spatial filter 116, image sensing device 118, driving mechanism 120, light-receiving element 122, driving mechanism 124, light-shielding plate 126, driving mechanism 128, and control unit 130.

The light source 102 is, for example, an ArF excimer laser having a wavelength of about 193 nm or a KrF excimer laser having a wavelength of about 248 nm. Light from the light source 102 is split into test light and reference light by the beam splitter 104.

The test light from the beam splitter 104 is converged on the pinhole 108a in the pinhole plate 108 via the extension optical system 110. Also, the reference light from the beam splitter 104 is converged on the pinhole 112a in the pinhole mirror 112 via the extension optical system 110. Note that the pinhole mirror 112 is arranged so as to form a certain angle with the test light which passes through the optical system OS (i.e., so as to prevent the test light from perpendicularly entering the pinhole mirror 112).

The test light having passed through the pinhole plate 108 is reflected by the pinhole mirror 112 upon passing through the optical system. The test light reflected by the pinhole mirror 112 and the reference light having passed through the pinhole 112a in the pinhole mirror 112 interfere with each other on the image sensing device 118 via the pupil imaging optical system 114 and the spatial filter 116 to form an interference pattern (interference fringes). The formed interference pattern is detected by the image sensing device 118. Note that the image sensing device 118 can move in the optical axis direction of the optical system OS (the pupil imaging optical system 114) by the driving mechanism 120.

Figure 2:
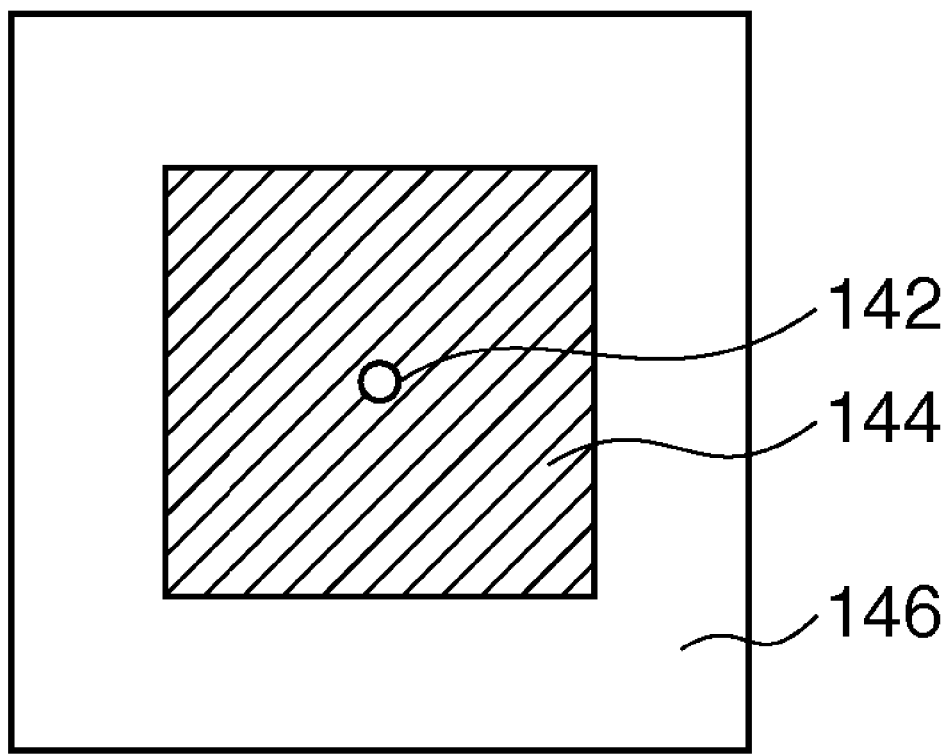
FIG. 2 is a schematic view showing a mask set at the position of a spatial filter when a CCD having an insufficient number of pixels is used as an image sensing device in the measurement apparatus shown in FIG. 1.

To achieve the measurement (calculation) of a flare which is generated in the optical system OS and has a long scattering distance, the image sensing device 118 is a CCD with a sufficiently high spatial resolution, for example, a CCD having 2,000×2,000 or more pixels. However, even if a CCD having an insufficient number of pixels is used as the image sensing device 118 under constraint, it is possible to expand the measurement range of flare scattering distance setting a mask 140 as shown in FIG. 2 at the position of the spatial filter 116. The mask 140 has a transparent portion 142 which transmits 0th-order light, a light-shielding portion 144 which shields diffracted light having a frequency lower than the Nyquist frequency of the pixels of the image sensing device 118, and a transparent portion 146 which transmits diffracted light having a frequency equal to or higher than the Nyquist frequency, as shown in FIG. 2. This makes it possible to calculate (measure) a flare with a scattering distance corresponding to a frequency equal to or higher than the Nyquist frequency of the pixels of a CCD used as the image sensing device 118. FIG. 2 is a schematic view showing the mask 140.

In addition, the image sensing device 118 is a CCD which is less likely to deteriorate high-frequency components attributed to, for example, a transfer function. Even if a CCD which is likely to deteriorate high-frequency components is used as the image sensing device 118 because of constraints involved, it is possible to correct the deterioration in high-frequency components as long as sensor noise is sufficiently small.

The light-receiving element 122 is insertable/retractable in/from the optical path between the pinhole plate 108 and the optical system OS by the driving mechanism 124. The light-receiving element 122 detects the light amount distribution of the light which passes through the pinhole 108a in the pinhole plate 108 and enters the optical system OS.

The light-shielding plate 126 is insertable in the optical path between the beam splitter 104 and the pinhole mirror 112 by the driving mechanism 128. The light-shielding plate 126 shields the reference light from the beam splitter 104 upon being inserted in the optical path between the beam splitter 104 and the pinhole mirror 112. With this operation, the image sensing device 118 can detect the light amount distribution of the test light reflected by the pinhole mirror 112.

The control unit 130 includes a CPU and memory and controls the operation and process of the measurement apparatus 1. For example, the control unit 130 controls the movement of the image sensing device 118 and the insertion/retraction of the light-receiving element 122 and light-shielding plate 126 in/from the optical path through the driving mechanisms 120, 124, and 128 to obtain phase information and light amount distribution information from the image sensing device 118 and the light-receiving element 122. The control unit 130 also functions as a calculation unit which calculates a flare generated in the optical system OS. More specifically, the control unit 130 determines the pupil function of the optical system OS based on, for example, the wavefront aberration and pupil transmittance distribution of the optical system OS, as will be described later. The control unit 130 performs imaging computation using the determined pupil function to obtain a light intensity distribution formed on the image plane of the optical system OS, and calculates a flare, generated in the optical system OS, from the obtained light intensity distribution.

A method of measuring a flare generated in the optical system OS in the first embodiment will be explained with reference to FIG. 3. This measurement method is executed by systematically controlling each unit of the measurement apparatus 1 by the control unit 130.

First, in step S302 (first measurement step), the wavefront aberration of the optical system OS on an arbitrary measurement surface (observation surface) is measured. In step S304 (second measurement step), the pupil transmittance distribution of the optical system to be measured OS on the same measurement surface as that used in step S302 is measured. Although the pupil transmittance distribution of the optical system OS is measured after the wavefront aberration of the optical system OS is measured in the first embodiment, the wavefront aberration of the optical system to be measured OS may be measured after the pupil transmittance distribution of the optical system OS is measured. In other words, in steps S302 and S304, it is to measure the wavefront aberration and pupil transmittance distribution of the optical system to be measured OS on the same measurement surface.

In step S306, the pupil function of the optical system OS is determined based on the wavefront aberration and pupil transmittance distribution of the optical system OS measured in steps S302 and S304.

Lastly, in step S308, imaging computation is performed using the pupil function of the optical system OS determined in step S306 to obtain a light intensity distribution formed on the image plane of the optical system OS, and a flare generated in the optical system OS is calculated from the obtained light intensity distribution.

Each step in the flowchart shown in FIG. 3 will be explained in detail below.

The measurement of the wavefront aberration and pupil transmittance distribution of the optical system OS in steps S302 and S304 will be explained. The image sensing device 118 is placed at a position conjugate to that of an arbitrary measurement surface of the optical system OS through the driving mechanism 120, and measures the wavefront aberration of the optical system OS. In this manner, the image sensing device 118 functions as a first measurement unit which measures the wavefront aberration of the optical system OS. Also, the light-shielding plate 126 is inserted in the optical path between the beam splitter 104 and the pinhole mirror 112 through the driving mechanism 128, and the image sensing device 118 detects the light amount distribution of the test light reflected by the pinhole mirror 112 upon passing through the optical system OS. The light-receiving element 122 is inserted in the optical path between the pinhole plate 108 and the optical system OS through the driving mechanism 124, and detects the light amount distribution of the test light which enters the optical system OS. The pupil transmittance distribution of the optical system OS is obtained based on the ratio between the light amount distributions detected by the image sensing device 118 and the light-receiving element 122. In this manner, the image sensing device 118 and the light-receiving element 122 function as a second measurement unit which measures the pupil transmittance distribution of the optical system OS in cooperation with each other. Note that because the incident light beams on the light-receiving element 122 are close to point sources, they may be regarded as having slow intensity distributions with small high-frequency component that may become a system error in flare measurement.

Although the wavefront aberration and pupil transmittance distribution on an arbitrary measurement surface are obtained using the pupil imaging optical system 114 in the first embodiment explained above, they may be obtained by propagation computation without the pupil imaging optical system 114. Also, the first embodiment explained above is a case in which the incident light beams on light-receiving element 122 have intensity distributions with small (i.e., negligible) high-frequency components. However, even when the incident light beams on light-receiving element 122 have intensity distributions with non-negligible high-frequency components, the pupil transmittance distribution of the optical system OS need only be obtained by adopting various types of calibration methods such as a method of obtaining high-frequency components by measuring the rotations of the optical system to be measured OS in a plurality of directions or averaging a plurality of measurement values on the same measurement surface.

The determination of the pupil function of the optical system OS in step S306 will be explained. If the pupil plane of the optical system OS is set as the measurement surface, the pupil function of the optical system to be measured OS is determined based on relation (2). If a plane other than the pupil plane of the optical system to be measured OS is set as the measurement surface, the pupil function of the optical system to be measured OS is determined by substituting the wavefront aberration and transmittance distribution measured on an arbitrary measurement plane for the pupil wavefront aberration and pupil transmittance distribution in relation (2). The reason why the wavefront aberration and transmittance distribution on an arbitrary measurement surface can be substituted for the pupil wavefront aberration and pupil transmittance distribution in relation (2) will be given later.

The calculation of a flare, generated in the optical system to be measured OS, in step S308 will be explained. Using the pupil function determined in step S306, an annular effective light source and a measurement pattern (see FIGS. 10A and 10B) such as that used in the Kirk method, for example, are set, and the Kirk method is reproduced by imaging computation, thereby obtaining a flare generated in the optical system OS.

The mechanism of determining the pupil function of the optical system to be measured OS using the wavefront aberration and pupil transmittance distribution on an arbitrary measurement surface in step S306 will be explained herein.

A complex amplitude component $P_k(x)$ which oscillates at a given spatial frequency f=(fx, fy) on the pupil plane of the optical system to be measured OS is given by:

$$P_k(x) = \{1 + A \cdot \cos(2\pi f \cdot x - \phi_A)\} \cdot e^{i \cdot B \cdot \cos(2\pi f \cdot x - \phi_B)} \quad (3)$$

where A is the amplitude of spatial oscillation (at the spatial frequency f) in the amplitude term of the complex amplitude on the pupil plane of the optical system OS, $\phi_A$ is the initial phase of spatial oscillation (at the spatial frequency f) in the amplitude term of the complex amplitude on the pupil plane of the optical system OS, B is the amplitude of spatial oscillation (at the spatial frequency f) in the phase term of the complex amplitude on the pupil plane of the optical system to be measured OS, and $\phi_B$ is the initial phase of spatial oscillation (at the spatial frequency f) in the phase term of the complex amplitude on the pupil plane of the optical system OS.

Since the flare ratio in the exposure apparatus is several percent or less, fluctuations in the pupil transmittance and wavefront aberration at the spatial frequency f are so small that A<<1 and B<<1 approximately hold. Using these approximations, relation (3) can be rewritten as:

$$P_k \cong (1 + A \cdot \cos(2\pi f \cdot x)) \cdot (1 + i \cdot B \cdot \cos(2\pi f \cdot x)) \quad (4)$$

$$\cong 1 + A \cdot \cos(2\pi f \cdot x - \phi_A) + i \cdot B \cdot \cos(2\pi f \cdot x - \phi_B)$$

(for $A \cdot B << A$ and $A \cdot B << B$)

The Fourier transform of the component $P_k(x)$ at the spatial frequency f corresponds to the light amplitude at the image position, and the square of the absolute value of that amplitude (power) corresponds to the light intensity at the image position. Referring to relation (4), the first term describes non-oscillation and therefore corresponds to a 0th-order diffracted light component, and the second and third terms describe spatial oscillations and therefore correspond to ±1st-order diffracted light components. Since a flare generated in the optical system OS has an intensity equivalent to that of diffracted light components, it can be accounted for by the second and third terms in relation (4) corresponding to the diffracted light. The sum of the powers of the second and third terms in relation (4) is $(A^2+B^2)$. Since a flare Flare is proportional to these powers, it is given by:

$$\text{Flare}=C \cdot (A^2+B^2) \quad (5)$$

where C is a constant.

An operation for shifting the position of the focal plane on which the component at the spatial frequency f expressed by relation (4) is present (defocusing this component) to set the measurement surface at an arbitrary position deviated from the pupil plane of the optical system OS, and measuring the defocused component will be considered. Like relations (3) and (4), a complex amplitude component $P_{def\ k}(x)$ which oscillates at a given spatial frequency f=(fx, fy) on the pupil plane of the optical system OS is given by:

$$P_k(x) = \{1 + A_{def} \cdot \cos(2\pi f \cdot x - \phi_{A_{def}})\} \cdot e^{i \cdot B_{def} \cdot \cos(2\pi f \cdot x - \phi_{B_{def}})} \quad (6)$$

$$\cong 1 + A_{def} \cdot \cos(2\pi f \cdot x - \phi_{A_{def}}) +$$

$$i \cdot B_{def} \cdot \cos(2\pi f \cdot x - \phi_{B_{def}})$$

where $A_{def}$ is the amplitude of spatial oscillation (at the spatial frequency f) in the amplitude term of the complex amplitude on the measurement surface of the optical system to be measured OS, $\phi_{A_{def}}$ is the initial phase of spatial oscillation (at the spatial frequency f) in the amplitude term of the complex amplitude on the measurement surface of the optical system OS, $B_{def}$ is the amplitude of spatial oscillation (at the spatial frequency f) in the phase term of the complex amplitude on the measurement surface of the optical system to be measured OS, and $\phi_{B_{def}}$ is the initial phase of spatial oscillation (at the spatial frequency f) in the phase term of the complex amplitude on the measurement surface of the optical system to be measured OS.

The relationship between the complex amplitude on the measurement surface of the optical system to be measured OS expressed by relation (6) and that on the pupil plane of the optical system OS will be explained. When the position of the measurement surface deviates from the pupil plane of the optical system to be measured OS, the 0th-order diffracted light component becomes out of phase with the ±1st-order diffracted light components upon defocus. Let $\phi_{def}$ be the phase difference of the ±1st-order diffracted light components with respect to the 0th-order diffracted light component. Then, multiplying the second and third terms of relation (4) by the phase difference $\phi_{def}$ yields a component $P_{\phi def\ k}(x)$ which is obtained by defocusing the component $P_k(x)$ and given by:

$$P_{\phi def\ k}(x)=1+\{A \cdot \cos(2\pi f x - \phi_A)+i \cdot B \cdot \cos(2\pi f x - \phi_B)\} \exp(i\phi_{def}) \quad (7)$$

Using approximations A<<1 and B<<1, relation (7) can be rewritten as:

$$P_{\phi def}(x)=1+\{A \cdot \cos(2\pi f x - \phi_A) \cdot \cos \phi_{def} - B \cdot \cos(2\pi f x - \phi_B) \cdot \sin \phi_{def}\} + i \cdot \{A \cdot \cos(2\pi f x - \phi_A) \cdot \sin \phi_{def} - B \cdot \cos(2\pi f x - \phi_B) \cdot \cos \phi_{def}\} \quad (8)$$

The second and third terms differ between relations (4) and (8). This proves that the measurement surface deviated from the pupil plane of the optical system OS exhibits a complex amplitude component $P_{\phi def\ k}(x)$ different from the complex amplitude component $P_k(x)$ on the pupil plane of the optical system OS. When the complex amplitude component $P_{\phi def k}(x)$ is assumed to correspond to the complex amplitude component $P_k(x)$ on the pupil plane of the optical system to be measured OS, like relation (5) a flare Flare$_{def}$ is given by:

$$\text{Flare}_{def} = C \cdot (A_{def}^2 + B_{def}^2) = C \cdot (A^2 + B^2) \quad (9)$$

In this manner, even when the position of the measurement surface of the optical system OS changes, the square sum of the amplitudes in the amplitude and phase terms remains the same, as expressed by relation (9). Note that the amplitude and RMS value of spatial oscillation of a single frequency component have a proportional relationship. For this reason, the same applies to a case in which the RMS values of spatial oscillations (at the spatial frequency f) in the amplitude and phase terms of the complex amplitude substitute for the amplitudes A and B, respectively, in relations (5) and (9) except that the constant C changes upon this substitution. Flares with different scattering distances and directions each are proportional to the square sum of the RMS values of the pupil transmittance distribution and wavefront aberration at each spatial frequency. The square sum of the RMS values of the pupil transmittance distribution and wavefront aberration at each spatial frequency remains the same irrespective of a change in the position of the measurement surface. As a consequence, a flare generated in the optical system OS can be calculated as long as imaging computation is performed using the pupil function determined based on the wavefront aberration and pupil transmittance distribution on an arbitrary measurement surface.

In the first embodiment, a pupil function is determined by directly using the measured wavefront aberration and pupil transmittance distribution. However, a pupil function may be determined using wavefront aberration data and pupil transmittance distribution data obtained by performing processes (e.g., correction processes) for the measured wavefront aberration and pupil transmittance distribution. For example, to measure (calculate) a flare with a scattering distance in a certain range, wavefront aberration data obtained by subtracting a slow distribution as described by low-order terms of Zernike's circle polynomials from the measured wavefront aberration or that obtained by frequency component filtering may be used. Moreover, to calculate a flare, generated in the optical system to be measured OS, by separating a slow transmittance distribution attributed to, for example, a change in the transmittance of a coated optical member with respect to the light incident angle on that member, pupil transmittance distribution data obtained by subtracting slow components from the measured pupil transmittance distribution may be used.

Although a case in which an annular effective light source and a measurement pattern (see FIGS. 10A and 10B) such as that used in the Kirk method are set, and the Kirk method is reproduced has been exemplified in the first embodiment, it is possible to set an arbitrary effective light source (effective light source distribution) and an arbitrary measurement pattern. For example, it is also possible to calculate a change in line width, which includes that attributed to the influence of flares generated by an optical system OS such as a projection optical system, by setting an effective light source and reticle pattern to be actually used in the process of fabricating semiconductor devices, and performing imaging computation.

The measurement apparatus 1 may be provided in an exposure apparatus, as will be described later. This makes it possible to periodically measure a flare generated in an optical system OS such as a projection optical system and manage (adjust) the exposure apparatus based on the measurement result.

In this manner, according to the first embodiment, it is possible to measure flares generated under various kinds of exposure conditions, including, for example, the reticle pattern and the illumination condition, for each of components with different scattering distances and directionalities. In other words, according to the first embodiment, it is possible to measure a wide range of flares including a flare with a long scattering distance (a flare with a scattering distance of about one to several hundreds of micrometers) with high accuracy while suppressing an increase in the measurement load.

In a second embodiment, the wavefront aberrations of an optical system such as a projection optical system on a plurality of different measurement surfaces are measured, and a flare generated in the optical system is obtained from the plurality of measured wavefront aberrations. Since high-frequency components of the pupil transmittance distribution of the optical system to be measured are not measured in the second embodiment, it is possible to obtain a flare generated in the optical system to be measured with high accuracy even when, for example, it is hard to measure high-frequency components of the pupil transmittance distribution with high accuracy.

Figure 4:
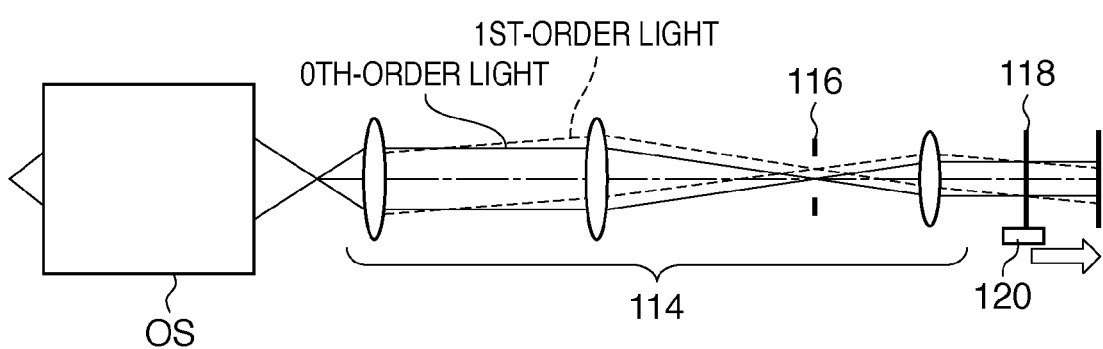
FIG. 4 is a schematic view showing a part of a measurement apparatus 1 as shown in FIG. 1.

In the second embodiment, a measurement apparatus 1 need not include a light-receiving element 122 and light-shielding plate 126, and it need only include a driving mechanism 120 which drives an image sensing device 118 in the optical axis direction of an optical system to be measured OS, as shown in FIG. 4. In other words, the measurement apparatus 1 is to be configured such that the measurement surface (focal position) of the optical system OS can be changed. Furthermore, the driving mechanism 120 is controlled to drive the image sensing device 118 by a predetermined amount (predetermined distance) prior to the change of the measurement surface of the optical system to be measured OS so as to obtain the distance between the measurement surfaces, before and after the change, which are used in measuring the wavefront aberration of the optical system to be measured OS. FIG. 4 is a schematic view showing a part of the measurement apparatus 1, and shows the state in which the measurement surface of the optical system to be measured OS is changed by driving the image sensing device 118.

Figure 5:
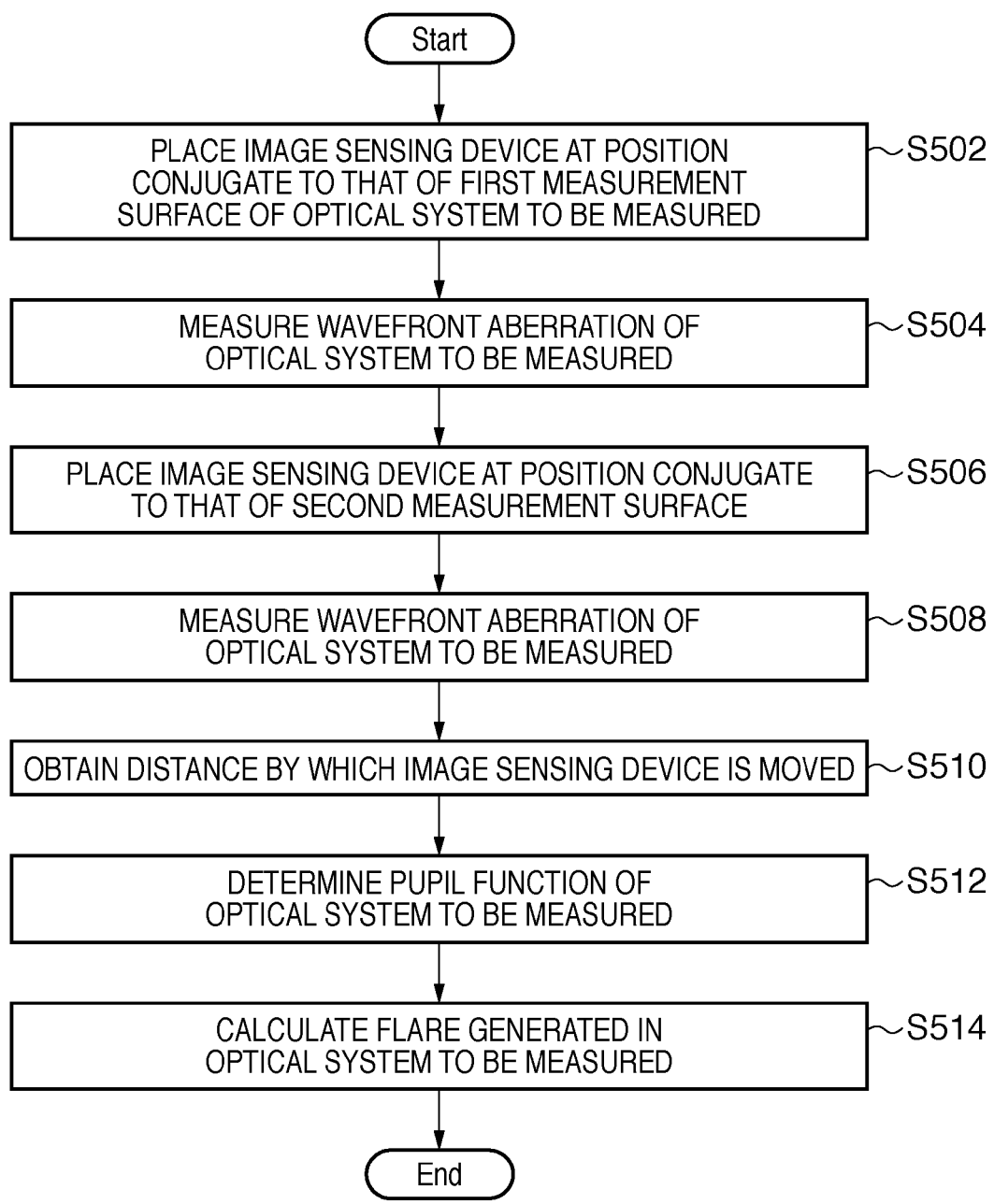
FIG. 5 is a flowchart for explaining a method of measuring a flare generated in an optical system to be measured in the second embodiment of the present invention.

A method of measuring a flare generated in the optical system to be measured OS in the second embodiment will be explained with reference to FIG. 5. This measurement method is executed by systematically controlling each unit of the measurement apparatus 1 by a control unit 130.

First, in step S502, the image sensing device 118 is placed at a position conjugate to that of a first measurement surface (observation surface) of the optical system OS through the driving mechanism 120.

In step S504, the wavefront aberration of the optical system OS is measured by the image sensing device 118 placed at a position conjugate to that of the first measurement surface of the optical system OS in step S502. In other words, the wavefront aberration of the optical system OS on the first measurement surface is measured (first measurement step).

In step S506, the image sensing device 118 is moved (defocused) by a predetermined distance in the optical axis direction of a pupil imaging optical system 114 through the driving mechanism 120 to place the image sensing device 118 at a position conjugate to that of a second measurement surface different from the first measurement surface.

In step S508, the wavefront aberration of the optical system OS is measured by the image sensing device 118 placed at a position conjugate to that of the second measurement surface. In other words, the wavefront aberration of the optical system OS on the second measurement surface is measured (second measurement step).

In the second embodiment, the wavefront aberrations of the optical system OS is measured on at least two different measurement surfaces. However, the wavefront aberrations of the optical system OS on three or more measurement surfaces may be measured while changing the measurement surface by repeating steps S506 and S508 a predetermined number of times.

In step S510, the distance (i.e., the distance between the first and second measurement surfaces) by which the image sensing device 118 is moved in step S506 is obtained.

In step S512, the pupil function of the optical system OS is determined based on the wavefront aberrations of the optical system OS measured in steps S504 and S508, and the distance by which the image sensing device 118 is moved and which has been obtained in step S510.

Lastly, in step S514, imaging computation is performed using the pupil function of the optical system OS determined in step S512 to obtain a light intensity distribution formed on the image plane of the optical system OS, and a flare generated in the optical system OS is calculated from the obtained light intensity distribution.

Each step in the flowchart shown in FIG. 5 will be explained in detail below.

Figure 3:
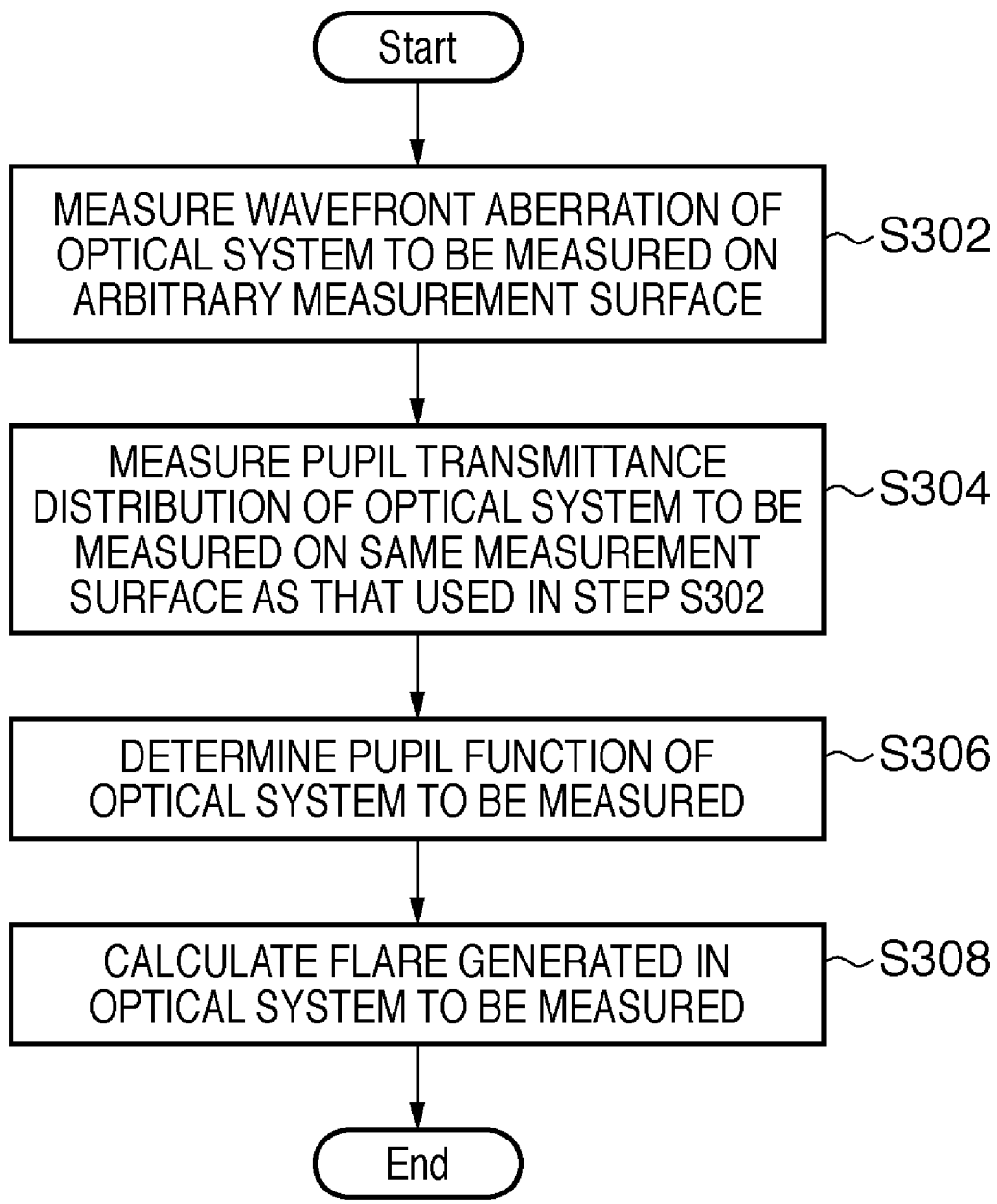
FIG. 3 is a flowchart for explaining a method of measuring a flare generated in an optical system to be measured in the first embodiment of the present invention.

The arrangements of the image sensing device 118 in steps S502 and S506, and the measurement of the wavefront aberrations of the optical system OS in steps S504 and S508 are the same as in step S302 of the flowchart shown in FIG. 3, which has been described in the first embodiment.

The determination of the pupil function of the optical system OS in step S512 will be explained. In this step, the wavefront aberration of the optical system OS on an arbitrary measurement surface is corrected using a correction value obtained from the wavefront aberrations of the optical system OS on a plurality of different measurement surfaces, thereby determining the pupil function of the optical system OS. Alternatively, the pupil transmittance distribution on an arbitrary measurement surface may be obtained from the wavefront aberrations on a plurality of different measurement surfaces, thereby determining the pupil function of the optical system OS using the wavefront aberration of the optical system OS on the same measurement surface as that used in obtaining the pupil transmittance distribution. A detailed method and principle of determining the pupil function of the optical system OS will be described later.

The calculation of a flare, generated in the optical system OS, in step S514 will be explained. Using the pupil function determined in step S512, an annular effective light source and a measurement pattern (see FIGS. 10A and 10B) such as that used in the Kirk method, for example, are set, and the Kirk method is reproduced by imaging computation, thereby obtaining a flare generated in the optical system OS.

A method and principle of determining the pupil function of the optical system OS from the wavefront aberrations of the optical system OS on a plurality of different measurement surfaces will be explained herein.

The complex amplitude on an arbitrary measurement surface (observation surface) is expressed by relations (6) and (8), as described above. When the wavefront aberration, i.e., the phase of the optical system OS alone is measured, a component associated with the phase in relations (6) and (8), i.e., a wavefront $W_{deff}(x)$ as given by:

$$W_{deff}(x) = B_{def} \cdot \cos(2\pi f \cdot x - \phi_{Bdef}) \quad (10)$$

$$\cong A \cdot \cos(2\pi f \cdot x - \phi_A) \cdot \sin\phi_{def} +$$

$$B \cdot \cos(2\pi f \cdot x - \phi_B) \cdot \cos\phi_{def}$$

$$= \left\{ \begin{array}{c} B \cdot \cos\phi_{def} \cdot \cos\phi_B + \\ A \cdot \sin\phi_{def} \cdot \cos\phi_A \end{array} \right\} \cdot \cos(2\pi f \cdot x) +$$

$$\left\{ \begin{array}{c} B \cdot \cos\phi_{def} \cdot \sin\phi_B + \\ A \cdot \sin\phi_{def} \cdot \sin\phi_A \end{array} \right\} \cdot \sin(2\pi f \cdot x)$$

is measured for a component which oscillates at a given spatial frequency f, where $B_{def}$ is the amplitude of spatial oscillation (at the spatial frequency f) in the phase term of the complex amplitude on an arbitrary measurement surface of the optical system OS, $\phi_{Bdef}$ is the initial phase of spatial oscillation (at the spatial frequency f) in the phase term of the complex amplitude on the same measurement surface (the foregoing arbitrary measurement surface) of the optical system OS, A is the amplitude of spatial oscillation (at the spatial frequency f) in the amplitude term of the complex amplitude on the pupil plane of the optical system OS, $\phi_A$ is the initial phase of spatial oscillation (at the spatial frequency f) in the amplitude term of the complex amplitude on the pupil plane of the optical system OS, B is the amplitude of spatial oscillation (at the spatial frequency f) in the phase term of the complex amplitude on the pupil plane of the optical system OS, $\phi_B$ is the initial phase of spatial oscillation (at the spatial frequency f) in the phase term of the complex amplitude on the pupil plane of the optical system OS, and $\phi_{def}$ is a phase difference which has occurred between the 0th-order diffracted light component and the ±1st-order diffracted light components upon defocus of the measurement surface from the pupil plane.

Fourier transformation of relation (10) for the spatial frequency f yields a power of a wavefront component corresponding to the diffracted light:

$$\frac{1}{2}\{A^2 + B^2\} + \frac{1}{2}\left\{ \begin{array}{c} (B^2 - A^2) \cdot \cos(2 \cdot \phi_{def}) + \\ A \cdot B \cdot \cos(\phi_A + \phi_B) \cdot \sin(2 \cdot \phi_{def}) \end{array} \right\} \quad (11)$$

Relation (11) represents that the power oscillates in accordance with a trigonometric function with respect to the phase difference $\phi_{def}$ between the 0th-order diffracted light component and the ±1st-order diffracted light components, which has occurred upon defocus. The center of oscillation is the first term $((A^2+B^2)/2)$ in relation (11). Accordingly, when a plurality of wavefront aberrations are measured while changing the phase difference $\phi_{def}$ and the relationship of the power of the wavefront aberration for each spatial frequency component to the phase difference $\phi_{def}$ is plotted, a graph which oscillates in accordance with a trigonometric function is obtained. The double of the oscillation center is equal to $(A^2+B^2)$ in relations (5) and (9).

The phase difference $\phi_{def}$ between the 0th-order diffracted light component and the ±1st-order diffracted light components, which occurs upon defocus by the distance by which the image sensing device 118 is moved differs depending on the spatial frequency f. Hence, it is to set the number of times of measurement and the position of the measurement surface so as to obtain the center of oscillation expressed by relation (11) across the range of the spatial frequency f corresponding to that of a flare scattering distance. This makes it possible to obtain an amount $(A^2+B^2)$ associated with the amplitudes A and B of the spatial frequency components in the amplitude and phase terms, respectively, at the spatial frequency f in the spatial frequency range of interest.

A case in which attention is paid to a flare corresponding to one spatial frequency f will be considered. In this case, second measurement need only be performed by shifting a phase difference $\phi_{def\ second}$ between the 0th-order diffracted light component and the ±1st-order diffracted light components in second measurement with respect to a phase difference $\phi_{def first}$ between the 0-th order diffracted light component and the ±1st-order diffracted light components in first measurement. With this operation, the phase differences and powers obtained in the first measurement and second measurement are given by:

First Measurment (12)

Phase Difference $\phi_{def\ first} = \frac{1}{2}(\phi_0 - \frac{\pi}{2})$

Power $\frac{1}{2}\{A^2 + B^2\} + \frac{1}{2}\left\{\begin{array}{l}(B^2 - A^2)\cdot\sin\phi_0 + \\ A\cdot B\cdot\cos(\phi_A + \phi_B)\cdot(-\cos\phi_0)\end{array}\right\}$ Second Measurement (13)

Phase Difference $\phi_{def\ second} = \frac{1}{2}(\phi_0 - \frac{\pi}{2})$

Power $\frac{1}{2}\{A^2 + B^2\} + \frac{1}{2}\left\{\begin{array}{l}(B^2 - A^2)\cdot(-\sin\phi_0) + \\ A\cdot B\cdot\cos(\phi_A + \phi_B)\cdot\cos\phi_0\end{array}\right\}$ Adding up the powers obtained in the first measurement and second measurement yields $(A^2+B^2)$.

Hence, when attention is paid to one spatial frequency f, it is possible to obtain $(A^2+B^2)$ from the wavefront aberrations on two different measurement surfaces.

In this manner, an amount $(A^2+B^2)$ associated with the amplitudes A and B of the spatial frequency components in the amplitude and phase terms, respectively, can be obtained from the wavefront aberrations of the optical system OS on a plurality of two or more measurement surfaces. A flare generated in the optical system OS can be calculated based on the amount $(A^2+B^2)$ associated with the amplitudes A and B of the spatial frequency components in the amplitude and phase terms, respectively. For example, a flare attributed to the pupil transmittance distribution can be calculated by correcting the wavefront aberration such that the power of the spatial frequency distribution of the wavefront aberration is $(A^2+B^2)$, and determining the pupil function of the optical system OS. Alternatively, a flare may be calculated by obtaining the amplitude of the spatial frequency component in the amplitude term on one measurement surface from relation (9), Fourier-transforming the wavefront aberration on the same measurement surface, adjusting the power of the Fourier transform for each spatial frequency, and inversely Fourier-transforming the power. This makes it possible to generate pseudo pupil transmittance data to calculate a flare.

A detailed method of determining the pupil function of the optical system OS will be explained by taking as an example a method of correcting the wavefront aberration of the optical system OS.

First, to obtain a correction value for correcting the wavefront aberration of the optical system OS, the plurality of wavefront aberrations measured in steps S504 and S508 are Fourier-transformed, the spatial frequency is divided for each frequency, and the power of each frequency (range) is obtained. If the flare directionality is negligible, the spatial frequency may be divided for each frequency in an arcuated pattern which uses the origin as the center. On the other hand, if the flare directionality is non-negligible, for example, if a flare is calculated for a line & space pattern in a certain direction, the spatial frequency is further divided in the direction.

Since a plot of the relationship of each frequency (range) pattern to the measurement surface or the phase difference $\phi_{def}$ oscillates in accordance with a trigonometric function, the value of the oscillation center is obtained. The square root of the quotient obtained by dividing the double of the center value by the power value of the wavefront aberration on a certain measurement surface is determined as a correction value (amplitude correction value) (i.e., a correction value is calculated). The amplitude term of the complex amplitude distribution obtained by Fourier-transforming the wavefront aberration on the same measurement surface is multiplied by the correction value, and the product is inversely Fourier-transformed to correct the wavefront aberration on the certain measurement surface. Using the corrected wavefront aberration, the pupil function of the optical system OS is determined. Note that the pupil transmittance distribution to determine the pupil function of the optical system OS can be, for example, a low-frequency pupil transmittance distribution measured separately, or the pupil transmittance distribution obtained from the transmittance of each optical component.

In this manner, according to the second embodiment, it is possible to measure flares generated under various kinds of exposure conditions, including, for example, the reticle pattern and the illumination condition, for each of components with different scattering distances and directionalities. In other words, according to the second embodiment, it is possible to measure a wide range of flares including a flare with a long scattering distance (a flare with a scattering distance of about one to several hundreds of micrometers) with high accuracy while suppressing an increase in the measurement load.

In a third embodiment, the wavefront aberration of an optical system is measured while changing, by a known amount, the phase difference between the 0th-order light component and ±1st-order light components of light which reflects the wavefront aberration of the optical system, and a flare generated in the optical system is obtained from the measured wavefront aberrations. Since high-frequency components of the pupil transmittance distribution of the optical system are not measured in the third embodiment, it is possible to obtain a flare generated in the optical system to be measured with high accuracy even when, for example, it is hard to measure high-frequency components of the pupil transmittance distribution with high accuracy. Moreover, the third embodiment is different from the second embodiment in that it is possible to generate a constant phase distance irrespective of the spatial frequency, thus obtaining flares in a wide range of spatial frequencies with high accuracy by a small number of times of measurement.

Figure 6:
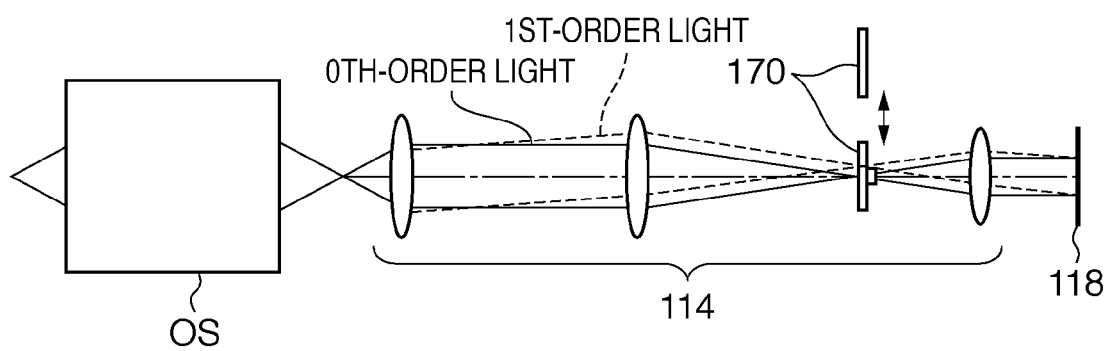
FIG. 6 is a schematic view showing a part of a measurement apparatus 1 as shown in FIG. 1.

In the third embodiment, a measurement apparatus 1 includes a plurality of phase filters 170, as shown in FIG. 6, in order to change the phase difference between the 0th-order light component and ±1st-order light components of light which reflects the wavefront aberration of an optical system to be measured OS. The plurality of phase filters 170 are exchangeably set at the position of a spatial filter 116 by, for example, a turret (not shown) under the control of a control unit 130. The plurality of phase filters 170 give different known amounts of phase differences to the 0th-order light component and ±1st-order light components of light which reflects the wavefront aberration of the optical system OS. With this mechanism, the change amount of the phase difference (i.e., the changed phase difference) between the 0th-order light component and the ±1st-order light components can be determined depending on which phase filter of the plurality of phase filters 170 is set at the position of the spatial filter 116. FIG. 6 is a schematic view showing a part of the measurement apparatus 1, and shows a state in which the phase difference between the 0th-order light component and ±1st-order light components of light which reflects the wavefront aberration of the optical system OS is changed by setting a phase filter 170 at the position of the spatial filter 116.

In the third embodiment, the measurement apparatus 1 need not include a light-receiving element 122 and light-shielding plate 126.

Figure 7:
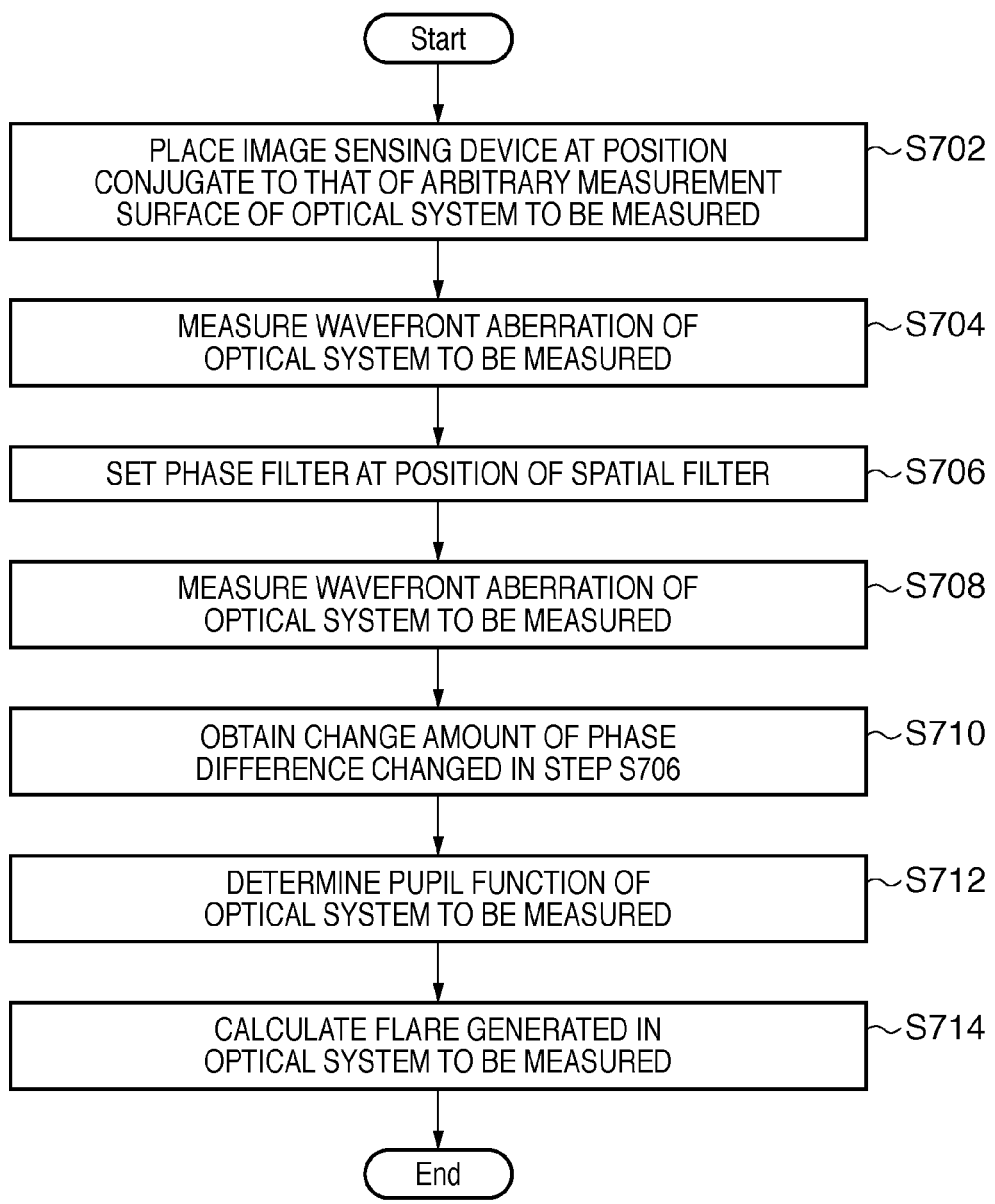
FIG. 7 is a flowchart for explaining a method of measuring a flare generated in an optical system to be measured in the third embodiment of the present invention.

A method of measuring a flare generated in the optical system OS in the third embodiment will be explained with reference to FIG. 7. This measurement method is executed by systematically controlling each unit of the measurement apparatus 1 by the control unit 130.

First, in step S702, an image sensing device 118 is placed at a position conjugate to that of an arbitrary measurement surface (observation surface) of the optical system OS through a driving mechanism 120.

In step S704, the wavefront aberration of the optical system OS is measured by the image sensing device 118 placed at a position conjugate to that of the arbitrary measurement surface of the optical system OS in step S702. In other words, the wavefront aberration of the optical system OS on the arbitrary measurement surface is measured (first measurement step).

In step S706, a predetermined phase filter of the plurality of phase filters 170 is set at the position of the spatial filter 116. With this operation, the phase difference between the 0th-order light component and ±1st-order light components of light which reflects the wavefront aberration of the optical system OS is changed by a known amount corresponding to the predetermined phase filter. More specifically, a phase filter which changes a phase difference $\phi_{def\ second}$ between the 0th-order diffracted light component and the ±1st-order diffracted light components in second measurement by n/2 with respect to a phase difference $\phi_{def\ first}$ between the 0th-order diffracted light component and the ±1st-order diffracted light components in first measurement is set for all spatial frequencies of interest.

In step S708, the wavefront aberration of the optical system OS is measured while the predetermined phase filter of the plurality of phase filters 170 is set at the position of the spatial filter 116 (second measurement step). From the two wavefront aberrations measured in steps S704 and S708, an amount ($A^2+B^2$) associated with an amplitude A of each spatial frequency component in the amplitude term and an amplitude B of each spatial frequency component in the phase term can be obtained based on relations (13) and (14).

In step S710, the change amount of the phase difference, between the 0th-order light component and ±1st-order light components of light which reflects the wavefront aberration of the optical system OS, that has been changed in step S706 is obtained.

In step S712, the pupil function of the optical system OS is determined based on the wavefront aberrations of the optical system OS measured in steps S704 and S708 and the phase difference obtained in step S710. The pupil function of the optical system OS can be determined in step S712 as in step S512 (second embodiment) of the flowchart shown in FIG. 5.

Lastly, in step S714, imaging computation is performed using the pupil function of the optical system OS determined in step S712 to obtain a light intensity distribution formed on the image plane of the optical system OS, and a flare generated in the optical system OS is calculated from the obtained light intensity distribution.

In this manner, according to the third embodiment, it is possible to measure flares generated under various kinds of exposure conditions, including, for example, the reticle pattern and the illumination condition, for each of components with different scattering distances and directionalities. In other words, according to the third embodiment, it is possible to measure a wide range of flares including a flare with a long scattering distance (a flare with a scattering distance of about one to several hundreds of micrometers) with high accuracy while suppressing an increase in the measurement load.

In a fourth embodiment, an exposure apparatus to which a measurement apparatus 1 is applied will be explained. FIG. 8 is a schematic view showing an exposure apparatus 400 according to one aspect of the present invention.

In this embodiment, the exposure apparatus 400 is a projection exposure apparatus which transfers the pattern of a reticle onto a substrate such as a wafer by the step & scan scheme. However, the exposure apparatus 400 can also adopt the step & repeat scheme or another exposure scheme.

The exposure apparatus 400 includes an illumination apparatus 410, a reticle stage 425 which mounts a reticle 420, a projection optical system 430, a wafer stage 445 which mounts a wafer 440, a main control unit 450, and a measurement apparatus 1. Note that the measurement apparatus 1 measures a flare generated in the projection optical system 430 as the optical system to be measured, and sends the measurement result to the main control unit 450. The detailed configuration and operation of the measurement apparatus 1 are as above, and a detailed description thereof will not be given herein.

The illumination apparatus 410 illuminates the reticle 420 on which a pattern to be transferred is formed, and includes a light source unit 412 and illumination optical system 414.

The light source unit 412 is, for example, an excimer laser such as an ArF excimer laser having a wavelength of about 193 nm or a KrF excimer laser having a wavelength of about 248 nm. However, the light source unit 412 is not limited to an excimer laser, and may be an $F_2$ laser having a wavelength of about 157 nm or one or a plurality of lamps such as mercury lamps or xenon lamps.

The illumination optical system 414 illuminates the reticle 420 with light from the light source unit 412. The illumination optical system 414 includes, for example, a beam shaping optical system, incoherent optical system, coherent optical system, and effective light source shape defining optical system.

The reticle 420 has a pattern (circuit pattern) to be transferred onto the wafer 440 and is supported and driven by the reticle stage 425. Diffracted light generated by the reticle 420 is projected onto the wafer 440 via the projection optical system 430.

The reticle stage 425 supports the reticle 420 and drives it in the X, Y, and Z directions and the rotation directions about the respective axes using, for example, a linear motor. In transferring the pattern of the reticle 420 onto the wafer 440, the reticle stage 425 inserts the reticle 420 on the object plane of the projection optical system 430. In measuring a flare generated in the projection optical system 430, the reticle stage 425 retracts the reticle 420 from the object plane of the projection optical system 430. At this time, a driving mechanism (not shown) arranges a pinhole mirror 112 on the object plane of the projection optical system 430.

The projection optical system 430 projects the pattern of the reticle 420 onto the wafer 440. The projection optical system 430 can be a dioptric system, a catadioptric system, or a catoptric system.

The wafer 440 is a substrate onto which the pattern of the reticle 420 is projected (transferred), and is coated with a photosensitive agent (resist). However, it is also possible to substitute the wafer 440 by a glass plate or another substrate.

The wafer stage 445 supports the wafer 440 and a pinhole plate 108 and drives them in the X, Y, and Z directions and the rotation directions about the respective axes using, for example, a linear motor. In transferring the pattern of the reticle 420 onto the wafer 440, the wafer stage 445 arranges the wafer 440 on the image plane of the projection optical system 430. In measuring a flare generated in the projection optical system 430, the wafer stage 445 arranges the pinhole plate 108 on the image plane of the projection optical system 430.

The main control unit 450 includes a CPU and memory (neither is shown) and controls the operation and process of the exposure apparatus 400. The main control unit 450 can also control an operation and process associated with the measurement of a flare generated in the projection optical system 430 in cooperation with a control unit 130 of the measurement apparatus 1. The main control unit 450 also functions as an adjusting unit which adjusts parameters settable for the exposure apparatus 400 based on the measurement result (a flare generated in the projection optical system 430) obtained by the measurement apparatus 1. More specifically, based on the measurement result obtained by the measurement apparatus 1, the main control unit 450 adjusts parameters settable for the exposure apparatus 400 so that a pattern with a line width is transferred onto the wafer 440. The parameters settable for the exposure apparatus 400 include, for example, parameters to define (adjust) the polarization state and an effective light source shape formed by the illumination optical system 414, and those to define (adjust) the positions and orientations of optical elements which constitute the projection optical system 430.

In the operation of the exposure apparatus 400, a flare generated in the projection optical system 430 is measured first. A flare generated in the projection optical system 430 is measured using the measurement apparatus 1, as described above. The measurement apparatus 1 can measure flares generated under various kinds of exposure conditions including, for example, the reticle pattern and the illumination condition. As a flare generated in the projection optical system 430 is measured, parameters settable for the exposure apparatus 400 are adjusted based on the measurement result. The measurement apparatus 1 can measure a wide range of flares including a flare with a long scattering distance with high accuracy, as described above. Hence, the main control unit 450 can adjust parameters settable for the exposure apparatus 400 with high accuracy so that the exposure apparatus 400 transfers a pattern with a line width onto the wafer 440.

Next, the pattern of the reticle 420 is transferred onto the wafer 440 by exposure. Light from the light source unit 412 illuminates the reticle 420 via the illumination optical system 414. The light which bears the information of the pattern of the reticle 420 forms an image on the wafer 440 via the projection optical system 430. Since the exposure apparatus 400 has various kinds of parameters adjusted so as to transfer a pattern with a line width onto the wafer 440, it attains an excellent exposure performance. Hence, the exposure apparatus 400 can provide high-quality devices (e.g., a semiconductor device and a liquid crystal display device) with a high throughput and good economical efficiency. The devices are fabricated by a step of exposing a substrate (e.g., a wafer or a glass plate) coated with a resist (photosensitive agent) using the exposure apparatus 400, a step of developing the exposed substrate, and other known steps.

If a flare is generated in the projection optical system 430, the line width of a pattern to be transferred onto the wafer 440 changes depending on an opening region around the pattern of the reticle 420, more specifically, the size and transmittance distribution of an opening region around the pattern. Hence, adjusting the design value of the reticle 420 makes it possible to transfer a pattern with a line width onto the wafer 440.

Figure 9:
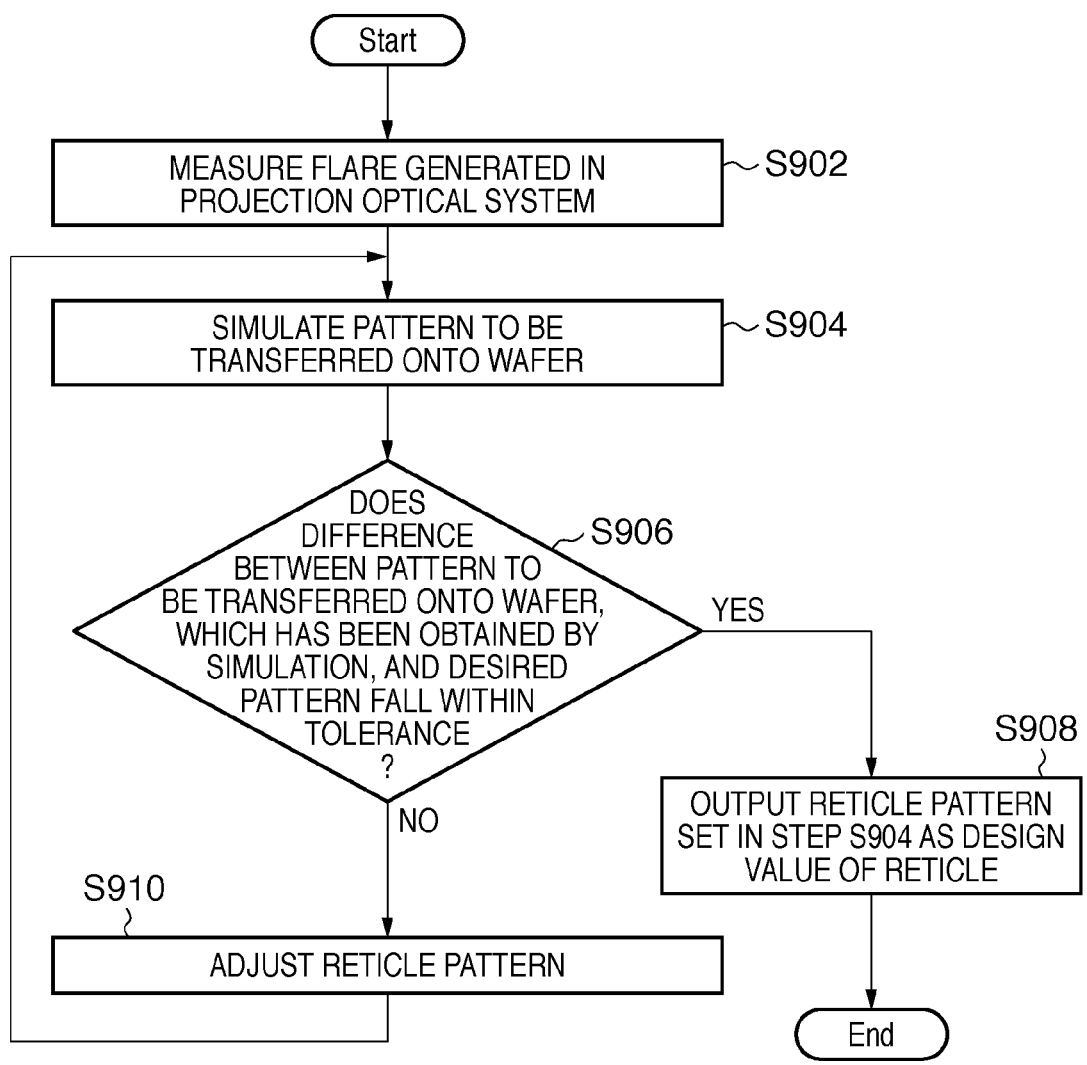
FIG. 9 is a flowchart for explaining a design method according to one aspect of the present invention.

A design method of designing the pattern of the reticle 420 will be explained below with reference to FIG. 9. Although the design method can be executed by the control unit 130 of the measurement apparatus 1 or the main control unit 450 of the exposure apparatus 400, it may be executed by another processing apparatus, as a matter of course.

First, in step S902, a flare generated in the projection optical system 430 is measured by the measurement apparatus 1 (according to any of the first to third embodiments).

In step S904, the exposure conditions including, for example, the pattern of the reticle 420 and the illumination condition are set, and imaging computation is performed using the pupil function of the projection optical system 430 obtained upon measuring a flare in step S902, thereby simulating a pattern to be transferred onto the wafer 440.

In step S906, it is checked whether the difference between the pattern to be transferred onto the wafer 440, which has been obtained by simulation, and a pattern (a target pattern to be formed on the wafer 440) (e.g., the difference in line width between these two patterns) falls within a tolerance.

If it is determined that the difference between the pattern to be transferred onto the wafer 440, which has been obtained by simulation, and the pattern falls within the tolerance, the process advances to step S908. On the other hand, if it is determined that the difference between the pattern to be transferred onto the wafer 440, which has been obtained by simulation, and the pattern falls outside the tolerance, the process advances to step S910.

In step S908, the pattern of the reticle 420 set in step S904 is output as the design value of the reticle 420.

In step S910, the pattern of the reticle 420 is adjusted (i.e., the pattern shape and the opening region around the pattern are adjusted) so that the adjusted pattern comes close to the pattern (the target pattern to be formed on the wafer 440). The process then returns to step S904 to set the pattern of the reticle 420 adjusted in step S910 and simulate a pattern to be transferred onto the wafer 440. At this time, other exposure conditions including, for example, the illumination condition are the same as those set in step S904 previously.

Although the pattern of the reticle 420 is designed by adjusting the pattern of the reticle 420 alone, it can also be designed by taking account of exposure conditions other than the pattern of the reticle 420.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-172642 filed on Jul. 1, 2008, which is hereby incorporated by reference herein in its entirety.

What is claimed is:

1. A method comprising:
measuring a wavefront aberration of an optical system to be measured on a measurement surface;
measuring a pupil transmittance distribution of the optical system;
determining a pupil function of the optical system based on the measured wavefront aberration and the measured pupil transmittance distribution; and
performing imaging computation using the determined pupil function to obtain a light intensity distribution formed on an image plane of the optical system, and calculating a flare, generated in the optical system, from the light intensity distribution.

2. An apparatus comprising:
a first measurement unit configured to measure a wavefront aberration of the optical system to be measured on a measurement surface;
a second measurement unit configured to measure a pupil transmittance distribution of the optical system; and
a calculation unit configured to calculate a flare, generated in the optical system, from the measured wavefront aberration and the measured pupil transmittance distribution,
wherein said calculation unit determines a pupil function of the optical system based on the measured wavefront aberration and the measured pupil transmittance distribution performs imaging computation using the pupil function to obtain a light intensity distribution formed on an image plane of the optical system, and calculates a flare, generated in the optical system, from the light intensity distribution.

3. An apparatus comprising:
an optical system configured to project a pattern of a reticle onto a substrate;
a measurement apparatus configured to measure a flare generated in the optical system; and
an adjusting unit configured to adjust a parameter settable for the apparatus based on the measured flare,
the measurement apparatus including
a first unit configured to measure a wavefront aberration of the optical system on a measurement surface,
a second unit configured to measure a pupil transmittance distribution of the optical system, and
a calculation unit configured to calculate a flare, generated in the optical system, from the measurement results obtained by the first and second units,
wherein the calculation unit determines a pupil function of the optical system based on the measured wavefront aberration and the measured pupil transmittance distribution, performs imaging computation using the pupil function to obtain a light intensity distribution formed on an image plane of the optical system, and calculates a flare, generated in the optical system, from the light intensity distribution.

4. A method comprising:
measuring a flare generated in an optical system;
adjusting a parameter settable for an exposure apparatus based on the measured flare; and
exposing a substrate using the exposure apparatus having the adjusted parameter,
the measuring including
measuring a wavefront aberration of the optical system on a measurement surface,
measuring a pupil transmittance distribution of the optical system,
determining a pupil function of the optical system based on the measured wavefront aberration and the measured pupil transmittance distribution, and
performing imaging computation using the determined pupil function to obtain a light intensity distribution formed on an image plane of the optical system, and calculating a flare, generated in the optical system, from the light intensity distribution.

5. A method comprising:
exposing a substrate using an exposure apparatus; and
performing a development process for the exposed substrate,
wherein the exposure apparatus includes:
an optical system configured to project a pattern of a reticle onto the substrate;
a measurement apparatus configured to measure a flare generated in the optical system; and
an adjusting unit configured to adjust a parameter settable for the exposure apparatus based on the measured flare,
said measurement apparatus including
a first unit configured to measure a wavefront aberration of the optical system on a measurement surface,
a second unit configured to measure a pupil transmittance distribution of the optical system, and
a calculation unit configured to calculate a flare, generated in the optical system, from the measurement results obtained by said first and second measurement units,
wherein said calculation unit determines a pupil function of the optical system based on the measured wavefront aberration and the measured pupil transmittance distribution, performs imaging computation using the pupil function to obtain a light intensity distribution formed on an image plane of the optical system, and calculates a flare, generated in the optical system, from the light intensity distribution.

6. A method comprising:
measuring a wavefront aberration of an optical system on a measurement surface;
measuring a pupil transmittance distribution of the optical system;
determining a pupil function of the optical system based on the measured wavefront aberration and the measured pupil transmittance distribution; and
performing imaging computation using the determined pupil function to obtain a light intensity distribution formed on an image plane of the optical system, and designing a pattern of a reticle to form a target pattern to be formed on the substrate is formed from the light intensity distribution.

* * * * *